US011349272B2

United States Patent
Miki

(10) Patent No.: US 11,349,272 B2
(45) Date of Patent: May 31, 2022

(54) LASER CHAMBER, METHOD FOR MANUFACTURING SEAL MEMBER, AND METHOD FOR MANUFACTURING ELECTRONIC DEVICE

(71) Applicant: Gigaphoton Inc., Tochigi (JP)

(72) Inventor: Masaharu Miki, Oyama (JP)

(73) Assignee: Gigaphoton Inc., Tochigi (JP)

(*) Notice: Subject to any disclaimer, the term of this patent is extended or adjusted under 35 U.S.C. 154(b) by 151 days.

(21) Appl. No.: 17/007,623

(22) Filed: Aug. 31, 2020

(65) Prior Publication Data

US 2020/0403369 A1 Dec. 24, 2020

Related U.S. Application Data

(63) Continuation of application No. PCT/JP2018/016491, filed on Apr. 23, 2018.

(51) Int. Cl.
| | |
|---|---|
| *H01S 3/22* | (2006.01) |
| *H01S 3/03* | (2006.01) |
| *H01S 3/225* | (2006.01) |
| *H01S 3/034* | (2006.01) |
| *H01S 3/134* | (2006.01) |

(52) U.S. Cl.
CPC ............ *H01S 3/0305* (2013.01); *H01S 3/034* (2013.01); *H01S 3/134* (2013.01); *H01S 3/225* (2013.01)

(58) Field of Classification Search
CPC ........ H01S 3/0305; H01S 3/225; H01S 3/034; H01S 3/134
See application file for complete search history.

(56) References Cited

U.S. PATENT DOCUMENTS

| 4,891,818 A | * | 1/1990 | Levatter | ................ H01S 3/0388 |
| | | | | 372/98 |
| 10,821,633 B1 | * | 11/2020 | Quinonez | ............... B29C 41/12 |
| 2001/0028670 A1 | * | 10/2001 | Tamura | .................. H01S 3/036 |
| | | | | 372/55 |

(Continued)

FOREIGN PATENT DOCUMENTS

| CN | 101275063 A | 10/2008 |
| CN | 102635716 A | 8/2012 |

(Continued)

OTHER PUBLICATIONS

An Office Action mailed by China National Intellectual Property Administration dated Dec. 29, 2021, which corresponds to Chinese Patent Application No. 201880090669.0 and is related to U.S. Appl. No. 17/007,623; with English language translation.

(Continued)

*Primary Examiner* — Kinam Park
(74) *Attorney, Agent, or Firm* — Studebaker & Brackett PC

(57) ABSTRACT

A laser chamber of an excimer laser apparatus includes a container including a first member and a second member and configured to accommodate a laser gas in the container and a seal member disposed between two seal surfaces facing each other, a seal surface of the first member and a seal surface of the second member. A laser-gas-side surface of the seal member is made of fluorine-based rubber, and an atmosphere-side surface of the seal member is formed of a film configured to suppress atmosphere transmission.

17 Claims, 9 Drawing Sheets

(56) References Cited

U.S. PATENT DOCUMENTS

| | | | | |
|---|---|---|---|---|
| 2002/0061045 | A1* | 5/2002 | Zhang | H01S 3/03 372/61 |
| 2003/0110781 | A1* | 6/2003 | Zurecki | B23Q 17/09 62/373 |
| 2005/0083984 | A1 | 4/2005 | Bragin et al. | |
| 2007/0280308 | A1* | 12/2007 | Ershov | H01S 3/225 372/25 |
| 2007/0297478 | A1* | 12/2007 | Kurushima | H01S 3/134 372/58 |
| 2010/0275845 | A1 | 11/2010 | Kogure | |
| 2014/0117629 | A1* | 5/2014 | Biallas | F16J 15/128 277/653 |
| 2014/0286366 | A1* | 9/2014 | Kumazaki | G03F 7/20 372/38.05 |
| 2015/0194781 | A1* | 7/2015 | Asayama | H01S 3/225 372/38.05 |
| 2017/0073134 | A1* | 3/2017 | Bradford | B65D 65/406 |

FOREIGN PATENT DOCUMENTS

| | | |
|---|---|---|
| JP | H04-349676 A | 12/1992 |
| JP | H06-029160 U | 4/1994 |
| JP | H07-015056 A | 1/1995 |
| JP | H10-256625 A | 9/1998 |
| JP | 2000-252554 A | 9/2000 |
| JP | 2001-148526 A | 5/2001 |
| JP | 2005-063986 A | 3/2005 |
| JP | 2005-524998 A | 8/2005 |
| WO | 03/096497 A1 | 11/2003 |

OTHER PUBLICATIONS

International Search Report issued in PCT/JP2018/016491; dated Jun. 19, 2018.

International Preliminary Report on Patentability and Written Opinion issued in PCT/JR2018/016491; dated Oct. 27, 2020.

* cited by examiner

LASER CHAMBER, METHOD FOR MANUFACTURING SEAL MEMBER, AND METHOD FOR MANUFACTURING ELECTRONIC DEVICE

CROSS-REFERENCE TO RELATED APPLICATIONS

The present application is a continuation application of International Application No. PCT/JP2018/016491, filed on Apr. 23, 2018, the entire contents of which are hereby incorporated by reference.

BACKGROUND

1. Technical Field

The present disclosure relates to a laser chamber, a method for manufacturing a seal member, and a method for manufacturing an electronic device.

2. Related Art

A semiconductor exposure apparatus is required to improve the resolution thereof as semiconductor integrated circuits are increasingly miniaturized and highly integrated. The semiconductor exposure apparatus is hereinafter referred simply to as an "exposure apparatus." Reduction in the wavelength of the light outputted from a light source for exposure is therefore underway. A gas laser apparatus is used as the light source for exposure in place of a mercury lamp in related art. At present, a KrF excimer laser apparatus, which outputs ultraviolet light having a wavelength of 248 nm, and an ArF excimer laser apparatus, which outputs ultraviolet light having a wavelength of 193 nm, are used as the gas laser apparatus for exposure.

As a current exposure technology, liquid-immersion exposure, in which the gap between the exposure lens of the exposure apparatus and a wafer is filled with a liquid, has been put into use. In the liquid-immersion exposure, since the refractive index of the gap between the exposure lens and the wafer changes, the apparent wavelength of the light from the light source for exposure shortens. In the liquid-immersion exposure with an ArF excimer laser apparatus used as the light source for exposure, the wafer is irradiated with ultraviolet light having an in-water wavelength of 134 nm. The technology described above is called ArF liquid-immersion exposure. The ArF liquid-immersion exposure is also called ArF liquid-immersion lithography.

Since KrF and ArF excimer laser apparatuses each output light having a wide spectral linewidth ranging from about 350 to 400 pm in spontaneous oscillation, the chromatic aberrations occur in association with the laser light (ultraviolet light) projected with the size thereof reduced onto the wafer via the projection lens of the exposure apparatus, resulting in a decrease in the resolution. To avoid the decrease in the resolution, the spectral linewidth of the laser light outputted from the gas laser apparatus needs to be narrow enough to make the chromatic aberrations negligible. The spectral linewidth is also called a spectral width. To this end, a line narrowing module including a line narrowing element is provided in the laser resonator of the gas laser apparatus, and the line narrowing module narrows the spectral width. The line narrowing element may, for example, be an etalon or a grating. A laser apparatus that outputs light having a narrowed spectral width described above is called a narrowed-line laser apparatus.

CITATION LIST

Patent Literature

[PTL 1] JP-A-10-256625

SUMMARY

A laser chamber of an excimer laser apparatus according to a viewpoint of the present disclosure includes a container including a first member and a second member and configured to accommodate a laser gas in the container and a seal member disposed between two seal surfaces facing each other, a seal surface of the first member and a seal surface of the second member. A laser-gas-side surface of the seal member is made of fluorine-based rubber, and an atmosphere-side surface of the seal member is formed of a film configured to suppress atmosphere transmission.

A seal member manufacturing method according to another viewpoint of the present disclosure is a method for manufacturing an annular seal member including a film on part of the surface thereof, the method including a first step of fitting an annular member that forms the seal member around an outer circumference of a first jig, a second step of sandwiching the annular member between a second jig disposed around an outer circumference of the first jig and a third jig disposed around the outer circumference of the first jig and moved in an axial direction of the first jig to allow a change in a distance between the second jig and the third jig to achieve a state in which an outer circumferential surface of the annular member is exposed between the second jig and the third jig, and a third step of forming the film on the outer circumferential surface of the annular member in a state in which an outer circumferential surface of the seal member is exposed between the second jig and the third jig.

An electronic device manufacturing method according to another viewpoint of the present disclosure includes causing an excimer laser apparatus including a laser chamber to produce laser light, outputting the laser light to an exposure apparatus, and exposing a light sensitive substrate to the laser light in the exposure apparatus to manufacture the electronic device. The laser chamber includes a container including a first member and a second member and configured to accommodate a laser gas in the container and a seal member disposed between two seal surfaces facing each other, a seal surface of the first member and a seal surface of the second member. A laser-gas-side surface of the seal member is made of fluorine-based rubber, and an atmosphere-side surface of the seal member is formed of a film configured to suppress atmosphere transmission.

BRIEF DESCRIPTION OF THE DRAWINGS

Embodiments of the present disclosure will be described below only by way of example with reference to the accompanying drawings.

DETAILED DESCRIPTION

Figure 1A:
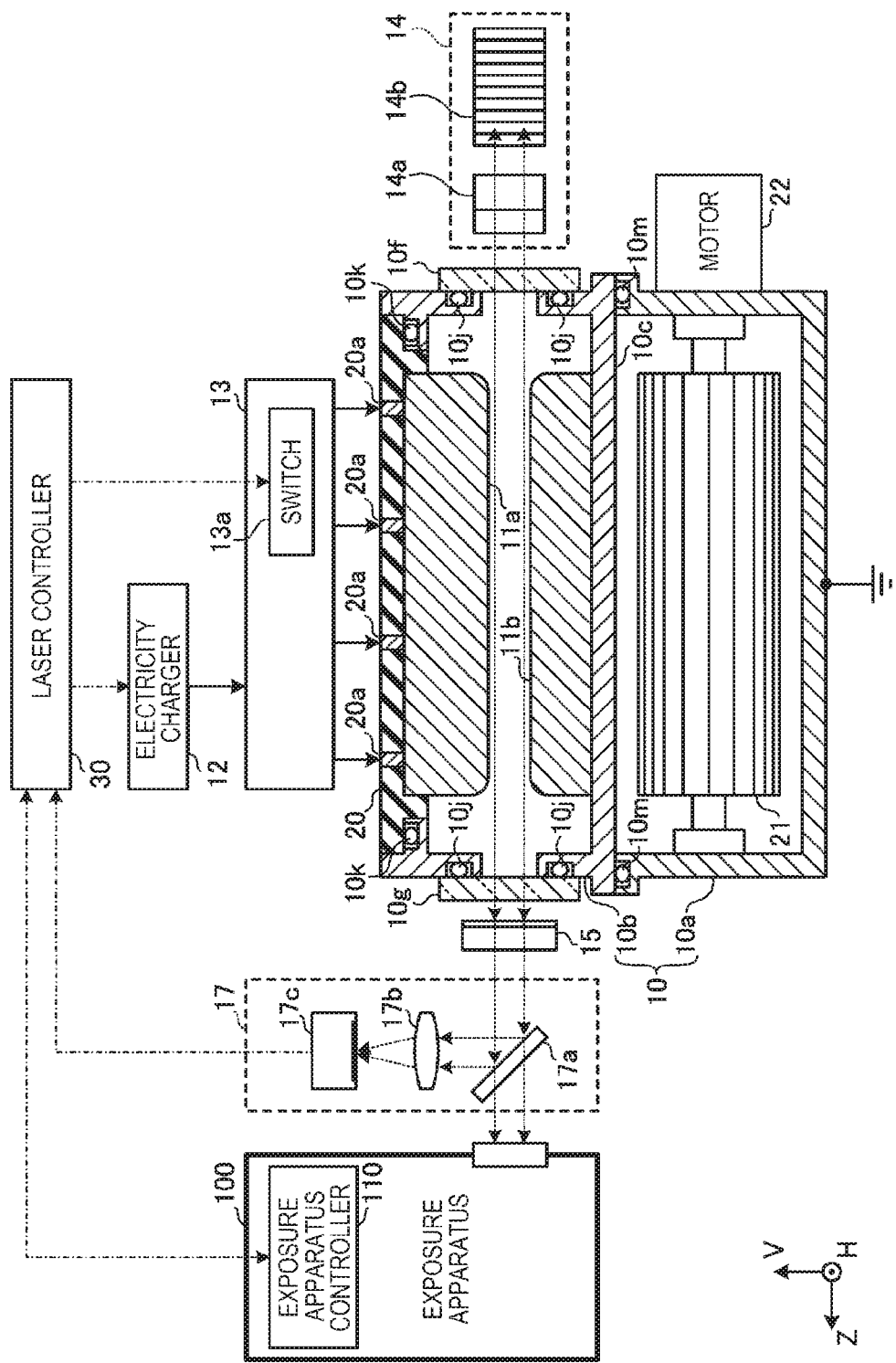
FIG. 1A diagrammatically shows the configuration of an excimer laser apparatus according to Comparative Example.

<Contents>
1. Comparative Example
1.1 Configuration of excimer laser apparatus
1.2 Operation of excimer laser apparatus
1.3 Seal member
1.3.1 Seal structure between holder $16a$ and optical crystal 16
1.3.2. Seal structure between container member $10b$ and window $10f$
1.3.3 Seal structures for other container members
1.4 Problems
2. Seal member including film configured to suppress transmission of atmosphere
2.1 Configuration
2.2 Effects
2.3 Others
3. Seal member including multilayer film
4. Examples of container members
5. Jig set
5.1 Configuration
5.2 Operation
6. Method for forming film including plurality of layers
7. Others Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Comparative Example 1.1 Configuration of Excimer Laser Apparatus

Figure 1B:
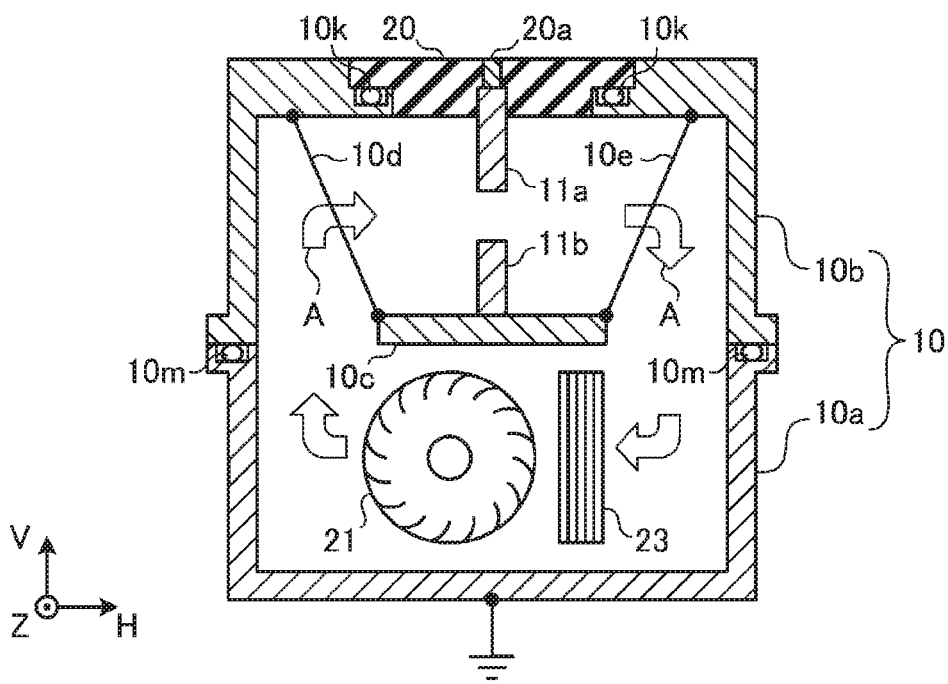
FIG. 1B diagrammatically shows the configuration of the excimer laser apparatus according to Comparative Example.

FIGS. 1A and 1B schematically show the configuration of an excimer laser apparatus according to Comparative Example. FIG. 1A shows the internal configuration of the excimer laser apparatus viewed along a direction substantially perpendicular to the direction in which discharge occurs between a pair of discharge electrodes $11a$ and $11b$ and further substantially perpendicular to the traveling direction of laser light outputted via an output coupling mirror 15. FIG. 1B shows the internal configuration of the excimer laser apparatus viewed in a direction substantially parallel to the traveling direction of the laser light outputted via the output coupling mirror 15. The traveling direction of the laser light outputted via the output coupling mirror 15 is called a direction +Z. The direction in which the discharge occurs between the discharge electrodes $11a$ and $11b$ is called a direction +V or −V. The direction perpendicular to the directions Z and V is called a direction +H or −H. The direction −V substantially coincides with the direction of gravity.

The excimer laser apparatus is used along with an exposure apparatus 100, as shown FIG. 1A. The laser light outputted from the excimer laser apparatus enters the exposure apparatus 100. The exposure apparatus 100 includes an exposure apparatus controller 110. The exposure apparatus controller 110 is configured to control the exposure apparatus 100. The exposure apparatus controller 110 is configured to transmit target pulse energy setting data and a light emission trigger signal to a laser controller 30 provided in the excimer laser apparatus.

The excimer laser apparatus includes a laser chamber 10, an electricity charger 12, a pulse power module 13, a line narrowing module 14, the output coupling mirror 15, an energy monitor 17, a crossflow fan 21, a motor 22, a heat exchanger 23, and the laser controller 30. The laser controller 30 is configured to collectively control the entire excimer laser apparatus.

The laser chamber 10 includes container members $10a$ and $10b$. The laser chamber 10 is disposed in the optical path of a laser resonator formed of the line narrowing module 14 and the output coupling mirror 15. The laser chamber 10 is provided with two windows $10f$ and $10g$. The laser chamber 10 is configured to accommodate the discharge electrodes $11a$ and $11b$. The laser chamber 10 is configured to accommodate a laser gas as a laser medium. The laser gas contains, for example, an argon gas, a fluorine gas, and a neon gas. The laser gas instead contains, for example, a krypton gas, a fluorine gas, and a neon gas.

An opening is formed in part of the container member $10b$ and closed by an electrical insulator 20. The electrical insulator 20 supports the discharge electrode $11a$. A plurality of electrical conductors $20a$ are buried in the electrical insulator 20. The electrical conductors $20a$ are each electrically connected to the discharge electrode $11a$.

A return plate $10c$ is disposed in the laser chamber 10. The container member $10b$ and the return plate $10c$ are electrically connected to each other via wiring lines $10d$ and $10e$ shown in FIG. 1B. The return plate $10c$ supports the discharge electrode 11b. The return plate 10c is electrically connected to the discharge electrode 11b.

Gaps through which the laser gas passes are provided on the far side and the near side of the return plate 10c in the plane of view of FIG. 1A, as shown in FIG. 1B.

The crossflow fan 21 is disposed in the laser chamber 10. The rotary shaft of the crossflow fan 21 is connected to the motor 22, which is disposed outside the laser chamber 10. The motor 22 is configured to rotate the crossflow fan 21. The laser gas thus circulates in the laser chamber 10, as indicated by the arrows A in FIG. 1B. The heat exchanger 23 is configured to discharge heat energy of the laser gas heated by the discharge out of the laser chamber 10.

The electricity charger 12 is configured to hold electrical energy to be supplied to the pulse power module 13. The pulse power module 13 includes a charging capacitor that is not shown and a switch 13a. The charging capacitor of the pulse power module 13 is connected to the electricity charger 12. The discharge electrode 11a is connected to the charging capacitor of the pulse power module 13.

The line narrowing module 14 includes a prism 14a, a grating 14b, and other wavelength selectors. The line narrowing module 14 may be replaced with a high-reflectance mirror.

The output coupling mirror 15 is formed of a partial reflection mirror.

The energy monitor 17 includes a beam splitter 17a, a light collection lens 17b, and an optical sensor 17c. The beam splitter 17a is disposed in the optical path of the laser light outputted via the output coupling mirror 15. The beam splitter 17a is configured to transmit part of the laser light outputted via the output coupling mirror 15 toward the exposure apparatus 100 at high transmittance and reflect the remainder of the laser light. The light collection lens 17b and the optical sensor 17c are disposed in the optical path of the laser light reflected off the beam splitter 17a.

1.2 Operation of Excimer Laser Apparatus

The laser controller 30 is configured to receive the target pulse energy setting data and the light emission trigger signal from the exposure apparatus controller 110. The laser controller 30 is configured to transmit charge voltage setting data to the electricity charger 12 based on the target pulse energy setting data received from the exposure apparatus controller 110. The laser controller 30 is configured to transmit a trigger signal to the pulse power module 13 based on the light emission trigger signal received from the exposure apparatus controller 110.

The pulse power module 13, which receives the trigger signal from the laser controller 30, is configured to produce a pulsed high voltage from the electrical energy charged in the electricity charger 12 and apply the high voltage to the space between the discharge electrodes 11a and 11b.

When the high voltage is applied to the space between the discharge electrodes 11a and 11b, discharge occurs between the discharge electrodes 11a and 11b. The energy of the discharge excites the laser gas in the laser chamber 10, and the laser gas transitions to a high energy level. Thereafter, when the excited laser gas transitions to a low energy level, the laser gas emits light having a wavelength according to the difference between the energy levels.

The light generated in the laser chamber 10 exits out of the laser chamber 10 via the windows 10f and 10g. The light having exited via the window 10f of the laser chamber 10 enters the prism 14a, which increases the beam width of the light, and the enlarged light is incident on the grating 14b. The light incident from the prism 14a on the grating 14b is reflected off and diffracted by a plurality of grooves of the grating 14b in the direction according to the wavelength of the light. The grating 14b is disposed in the Littrow arrangement, which allows the angle of incidence of the light incident from the prism 14a on the grating 14b to coincide with the angle of diffraction of the diffracted light having a desired wavelength. The light having the desired wavelength and wavelengths close thereto thus returns to the laser chamber 10 via the prism 14a.

The output coupling mirror 15 is configured to transmit and output part of the light having exited via the window 10g of the laser chamber 10 and reflect the remainder of the light back into the laser chamber 10.

The light having exited out of the laser chamber 10 thus travels back and forth between the line narrowing module 14 and the output coupling mirror 15. The light is amplified whenever passing through the discharge space between the discharge electrodes 11a and 11b. The light is narrowed in terms of linewidth whenever turned back by the line narrowing module 14. The light having undergone the laser oscillation and the line narrowing as described above is outputted as the laser light via the output coupling mirror 15.

The light collection lens 17b provided in the energy monitor 17 is configured to collect the laser light reflected off the beam splitter 17a onto the optical sensor 17c. The optical sensor 17c is configured to transmit as measured data to the laser controller 30 an electrical signal according to the pulse energy of the laser light collected by the light collection lens 17b.

The laser controller 30 is configured to receive the measured data from the energy monitor 17. The laser controller 30 is configured to perform feedback control on the charge voltage set in the electricity charger 12 based on the pulse energy measured data received from the energy monitor 17 and the target pulse energy setting data received from the exposure apparatus controller 110.

1.3 Seal Member

Figure 2:
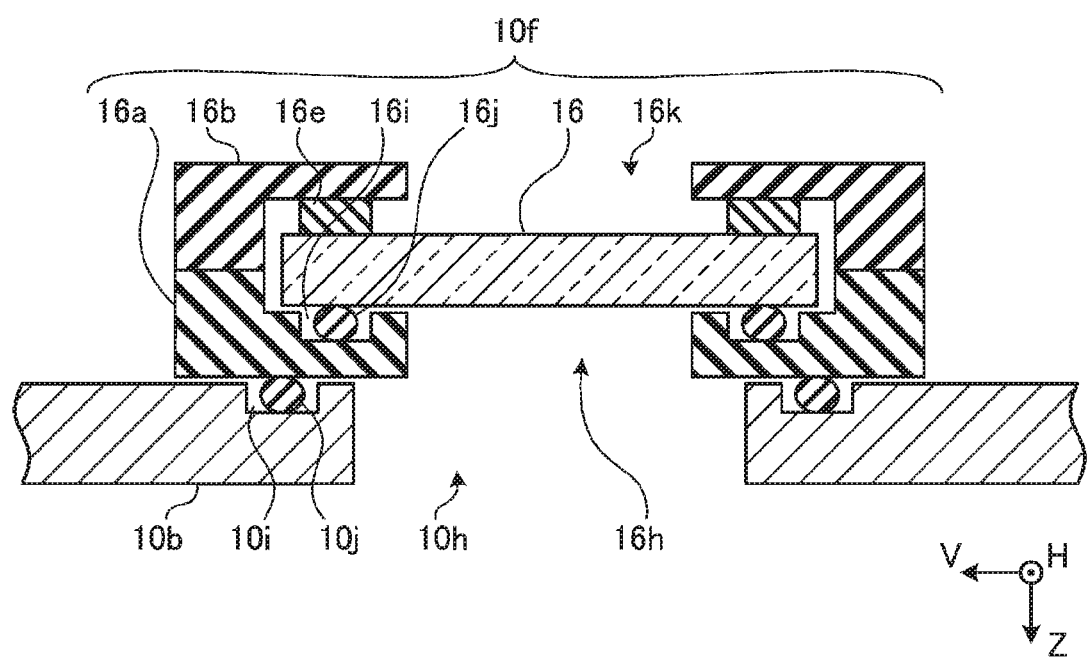
FIG. 2 is a cross-sectional view showing an example of the configuration of seal mechanisms each using a seal member in Comparative Example.

FIG. 2 is a cross-sectional view showing an example of the configuration of seal mechanisms each using a seal member in Comparative Example. FIG. 2 shows a case where the gap between the container member 10b and the window 10f is sealed and the gap between a holder 16a of the window 10f and an optical crystal 16 is sealed.

1.3.1 Seal Structure Between Holder 16a and Optical Crystal 16

The window 10f includes the optical crystal 16, the holder 16a, and a holder 16b. The optical crystal 16 is held between the holders 16a and 16b. The holder 16a has an opening 16h. The holder 16a further has a groove 16i around the opening 16h. The holder 16b has an opening 16k.

A seal member 16j is disposed between the optical crystal 16 and the holder 16a. The seal member 16j is disposed in the groove 16i. The seal member 16j is an annular O ring. A buffer 16e is disposed between the optical crystal 16 and the holder 16b.

The holders 16a and 16b are fixed around the optical crystal 16 to each other, for example, via bolts that are not shown. The optical crystal 16 is made, for example, of a calcium fluoride crystal and has a disc-like shape. The holder 16b is made, for example, of ceramic or aluminum. The buffer 16e is made, for example, of stainless steel or aluminum.

In the thus configured window 10f, the optical crystal 16 is configured to close the opening 16h of the holder 16a. The seal member 16j, which is disposed between two seal surfaces facing each other, a seal surface of the optical crystal 16 and a seal surface of the holder 16a, is configured to seal the opening 16h and hermetically separate the laser gas side and the atmosphere side from each other.

1.3.2. Seal Structure Between Container Member 10b and Window 10f

The container member 10b has an opening 10h.

The container member 10b further has a groove 10i around the opening 10h. A seal member 10j is disposed in the groove 10i. The seal member 10j is an annular O ring. The container member 10b and the holders 16a, 16b of the window 10f are fixed around the groove 10i and the seal member 10j to each other, for example, via bolts that are not shown. In this example, the container member 10b corresponds to the first member in the present disclosure, and the window 10f corresponds to the second member in the present disclosure. The container member 10b is made, for example, of metal, such as nickel-plated aluminum. The holders 16a and 16b of the window 10f are made, for example, of ceramic or aluminum.

The thus configured window 10f closes the opening 10h of the container member 10b. The seal member 10j, which is disposed between two seal surfaces facing each other, a seal surface of the container member 10b and a seal surface of the window 10f, is configured to seal the opening 10h and hermetically separate the laser gas side and the atmosphere side from each other.

The pulsed laser light can pass through the opening 10h of the container member 10b, the opening 16h of the holder 16a, a central portion of the optical crystal 16, and the opening 16k of the holder 16b.

1.3.3 Seal Structures for Other Container Members

Referring to FIGS. 1A and 1B again, an annular seal member 10k disposed around the opening of the container member 10b seals the gap between the container member 10b and the electrical insulator 20. The container member 10b and the electrical insulator 20 are fixed around the seal member 10k to each other, for example, via bolts that are not shown. In this case, the container member 10b corresponds to the first member in the present disclosure, and the electrical insulator 20 corresponds to the second member in the present disclosure. The container member 10b is made, for example, of metal, such as nickel-plated aluminum. The electrical insulator 20 is made, for example, of ceramic.

The thus configured electrical insulator 20 closes the opening of the container member 10b. The seal member 10k, which is disposed between two seal surfaces facing each other, a seal surface of the container member 10b and a seal surface of the electrical insulator 20, is configured to hermetically separate the laser gas side and the atmosphere side from each other.

An annular seal member 10m disposed around an opening of the container member 10a seals the gap between the container members 10a and 10b. The container members 10a and 10b are fixed around the seal member 10m to each other, for example, via bolts that are not shown. In this case, the container member 10a corresponds to the first member in the present disclosure, and the container member 10b corresponds to the second member in the present disclosure. The container members 10a and 10b are made, for example, of metal, such as nickel-plated aluminum.

The thus configured container member 10b closes the opening of the container member 10a. The seal member 10m, which is disposed between two seal surfaces facing each other, a seal surface of the container member 10a and a seal surface of the container member 10b, is configured to hermetically separate the laser gas side and the atmosphere side from each other.

1.4 Problems

Figure 3:
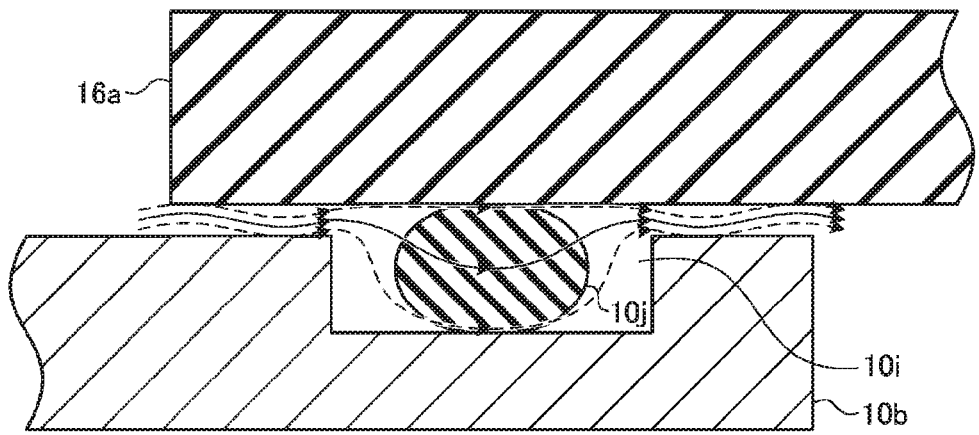
FIG. 3 is a partially enlarged cross-sectional view of the seal structure shown in FIG. 2.

FIG. 3 is a partially enlarged cross-sectional view of one of the seal structures shown in FIG. 2. The metal of which the container member 10b is made differs from the ceramic of which the holder 16a of the window 10f is made in terms of coefficient of thermal expansion. It is therefore preferable that the seal member 10j is made of elastomer. The seal member 10j made of elastomer can absorb discrepancy resulting from the difference in thermal expansion between the container member 10b and the holder 16a of the window 10f. The seal member 10j is preferably made, for example, of fluorine-based rubber resistant to fluorine gases. Preferable examples of the fluorine-based rubber may include fluoroelastomer and Viton (registered trademark). The seal member 16j, which has been described with reference to FIG. 2, is also preferably made of elastomer to suppress damage of the optical crystal 16.

The seal member 10j, however, cannot achieve zero transmission of the atmosphere from the atmosphere side into the laser chamber 10 in some cases. There are two atmosphere transmission paths in the seal member 10j: A first transmission path is a transmission path along the seal surface of the container member 10b or the holder 16a in contact with the seal member 10j and is indicated by the broken-line arrows in FIG. 3; and a second transmission path is a transmission path passing through the interior of the seal member 10j and is indicated by the solid-line arrow in FIG. 3. When the seal member 10j is made of elastomer, the second transmission path allows transmission of the atmosphere by an amount at least 10 times greater than the amount of atmosphere allowed to pass along the first transmission path in some cases. For example, oxygen or water vapor in the atmosphere passes through elastomer in some cases. When the atmosphere passes into the laser chamber 10 from the atmosphere side, the laser gas in the laser chamber 10 is contaminated. The consumption of the gas to be exchanged therefore increases in some cases.

In embodiments described below, a film configured to suppress transmission of the atmosphere is formed on the atmosphere-side surface of a seal member. Using the seal member including the film suppresses transmission of the atmosphere via the interior of the seal member 10j and in turn suppresses the contamination of the laser gas.

Figure 4:
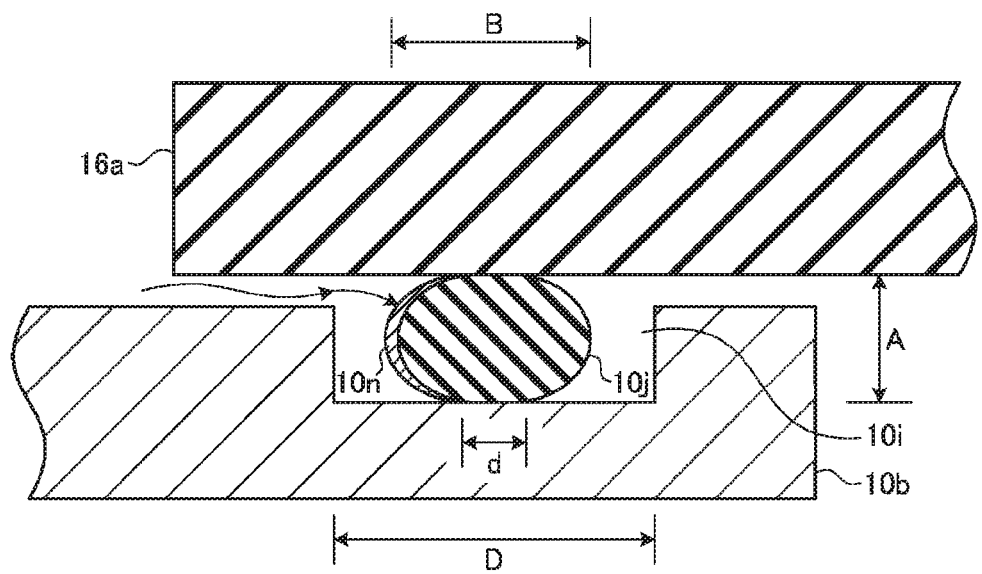
FIG. 4 is a cross-sectional view showing part of a seal structure in a first embodiment of the present disclosure.

2. Seal Member Including Film Configured to Suppress Transmission of Atmosphere 2.1 Configuration FIG. 4 is a cross-sectional view showing part of a seal structure in a first embodiment of the present disclosure. FIG. 4 shows the cross section of the portion corresponding to FIG. 3 in the first embodiment. A film 10n is formed on the atmosphere-side surface of the seal member 10j, as shown in FIG. 4. The film 10n is not formed on the laser-gas-side surface of the seal member 10j, and the fluorine-based rubber is exposed via the laser-gas-side surface of the seal member 10j. The film 10n is not formed also on the surfaces of the seal member 10j that are in contact with the seal surfaces of the container member 10b and the holder 16a, and the fluorine-based rubber is in contact with the container member 10b and the holder 16a.

The film 10n contains, for example, fluorine-containing diamond-like carbon. The film 10n instead contains at least one of $Al_2O_3$, $SiO_2$, and TiO.

The film 10n desirably has a thickness, for example, greater than or equal to 0.1 μm but smaller than or equal to 0.3 μm. The film 10n is preferably so formed that the thickness thereof is thick in positions separate from the seal surfaces of the container member 10b and the holder 16a but thin in positions close to the seal surfaces of the container member 10b and the holder 16a.

2.2 Effects

In the first embodiment, the formation of the film 10n, which suppresses transmission of the atmosphere, on the atmosphere-side surface of the seal member 10j reduces the amount of atmosphere that passes through the interior of the seal member 10j to an amount smaller than or equal to about 50% of the amount of atmosphere that passes through the interior of the seal member 10j when the film 10n is not formed. Even if the surface of the film 10n cracks, most of the atmosphere-side surface of the seal member 10j is covered with the film 10n, and it is therefore believed that the cracks do not greatly affect the performance of the suppression of the atmosphere transmission.

Further, according to the first embodiment, the amount of atmosphere that passes along a seal surface of the container member 10b or the holder 16a that is the surface in contact with the seal member 10j can be maintained small, as in Comparative Example described above. Further, the force used to fasten the holder 16a to the container member 10b can be equal to the fastening force in Comparative Example described above.

Formation of similar films on the surfaces of the seal member 10j that are in contact with the seal surfaces of the container member 10b and the holder 16a could cause the seal performance of the films to be lost when the films crack. To avoid the problem described above, it is desirable not to form a film on a surface of the seal member 10j that is the surface in contact with the seal surface of the container member 10b or the holder 16a.

Further, according to the first embodiment, the fluorine-based rubber is exposed via the laser-gas-side surface of the seal member 10j, whereby resistance to the fluorine gas can be achieved as in Comparative Example described above. Since the film 10n has low resistance to fluorine gases, it is desirable not to form the film 10n on the laser-gas-side surface of the seal member 10j.

2.3 Others

FIG. 3 shows the seal member 10j disposed between the container member 10b and the holder 16a of the window 10f, but not necessarily in the present disclosure.

A film configured to suppress the atmosphere transmission may be formed on the atmosphere-side surface of the seal member 16j disposed between the optical crystal 16 and the holder 16a shown in FIG. 2. A film configured to suppress the atmosphere transmission may be formed on the atmosphere-side surface of the seal member 10k disposed between the container member 10b and the electrical insulator 20 shown in FIGS. 1A and 1B. A film configured to suppress the atmosphere transmission may be formed on the atmosphere-side surface of the seal member 10m disposed between the container members 10a and 10b shown in FIGS. 1A and 1B.

3. Seal Member Including Multilayer Film

Figure 5:
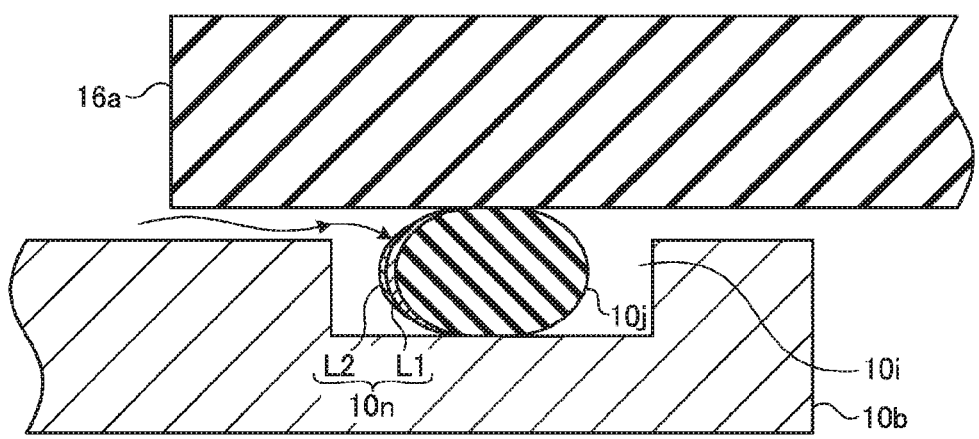
FIG. 5 diagrammatically shows a cross section of a seal member in a second embodiment of the present disclosure.

FIG. 5 diagrammatically shows a cross section of a seal member in a second embodiment of the present disclosure. The film 10n formed on the seal member 10j includes a plurality of layers configured to suppress the atmosphere transmission.

The plurality of layers include a first layer L1 and a second layer L2, which is located closer to the atmosphere side than the first layer L1. The plurality of layers do not necessarily include two layers and may include three or more layers. Even when the film 10n includes a plurality of layers, the thickness of the film 10n is desirably greater than or equal to 0.1 μm but smaller than or equal to 0.3 μm.

It is desirable that the area of the second layer L2 is smaller than that of the first layer L1. It is further desirable that the second layer L2 is thinner than the first layer L1. A situation in which the film 10n peels off or breaks can thus be suppressed even when stress is induced in the seal member 10j.

The other points are the same as those in the first embodiment.

4. Examples of Container Members

Figure 6A:
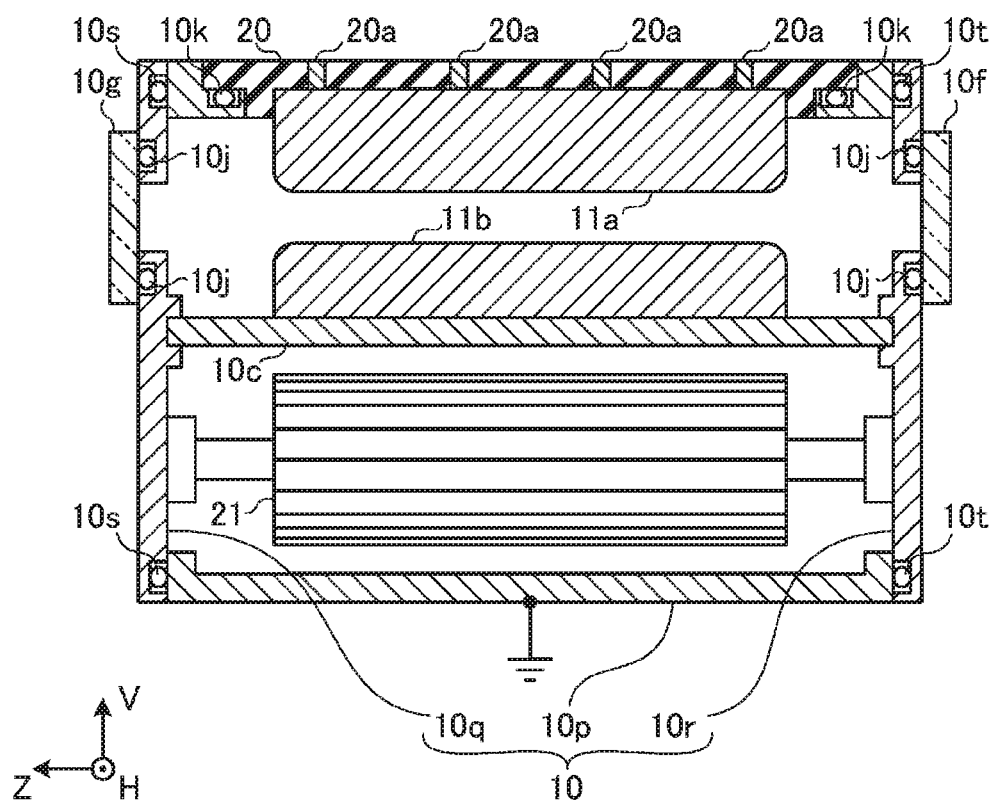
FIG. 6A diagrammatically shows the configuration of an excimer laser apparatus according to a third embodiment of the present disclosure.
Figure 6B:
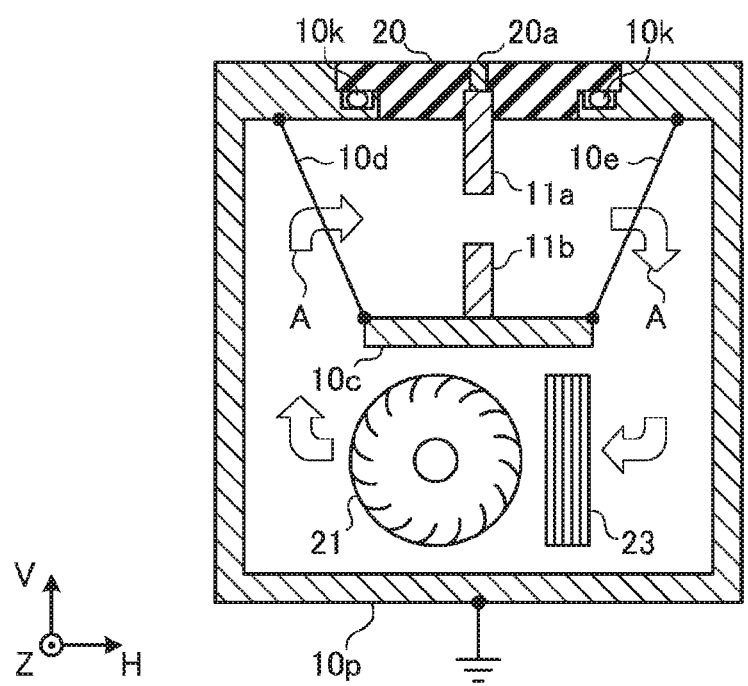
FIG. 6B diagrammatically shows the configuration of the excimer laser apparatus according to the third embodiment of the present disclosure.

FIGS. 6A and 6B diagrammatically show the configuration of an excimer laser apparatus according to a third embodiment of the present disclosure. FIGS. 6A and 6B are cross-sectional views of the portions corresponding to FIGS. 1A and 1B, respectively. It is, however, noted that the laser resonator and other components disposed outside the laser chamber 10 are omitted in FIG. 6A.

In the third embodiment, the laser chamber 10 includes container members 10p, 10q, and 10r. The container member 10p is a tubular member. The container members 10q and 10r are disposed at +Z-direction-side-end and −Z-direction-side-end openings of the container member 10p, respectively.

An annular seal member 10s disposed around the +Z-direction-side-end opening of the container member 10p seals the gap between the container member 10p and the container member 10q. The container members 10p and 10q are fixed around the seal member 10s to each other, for example, via bolts that are not shown. In this case, the container member 10p corresponds to the first member in the present disclosure, and the container member 10q corresponds to the second member in the present disclosure. The container members 10p and 10q are made, for example, of metal, such as nickel-plated aluminum.

The thus configured container member 10q closes the opening of the container member 10p. The seal member 10s, which is disposed between two seal surfaces facing each other, a seal surface of the container member 10p and a seal surface of the container member 10q, is configured to hermetically separate the laser gas side and the atmosphere side from each other.

A film configured to suppress the atmosphere transmission may be formed on the atmosphere-side surface of the seal member 10s.

An annular seal member 10t disposed around the −Z-direction-side-end opening of the container member 10p similarly seals the gap between the container member 10p and the container member 10r. The container members 10p and 10r are fixed around the seal member 10t to each other, for example, via bolts that are not shown. In this case, the container member 10p corresponds to the first member in the present disclosure, and the container member 10r corresponds to the second member in the present disclosure. The container members 10p and 10r are made, for example, of metal, such as nickel-plated aluminum.

The thus configured container member 10r closes the opening of the container member 10p. The seal member 10t, which is disposed between two seal surfaces facing each other, a seal surface of the container member 10p and a seal surface of the container member 10r, is configured to hermetically separate the laser gas side and the atmosphere side from each other.

A film configured to suppress the atmosphere transmission may be formed on the atmosphere-side surface of the seal member 10t.

The other points are the same as those in the first and second embodiments.

5. Jig Set

5.1 Configuration

Figure 7A:
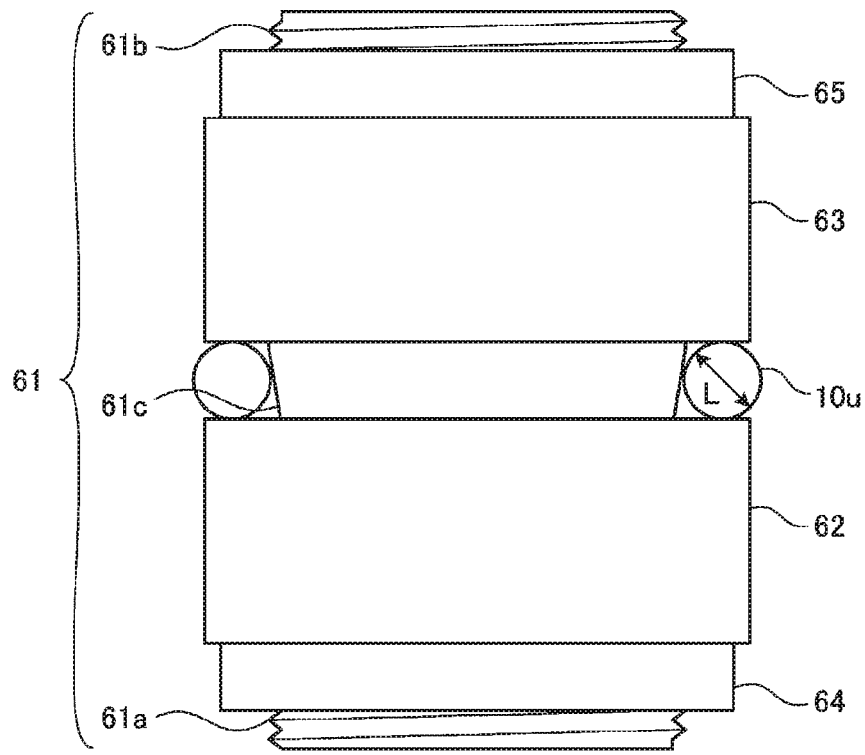
FIG. 7A schematically shows a jig set used in a seal member manufacturing method according to a fourth embodiment of the present disclosure.
Figure 7B:
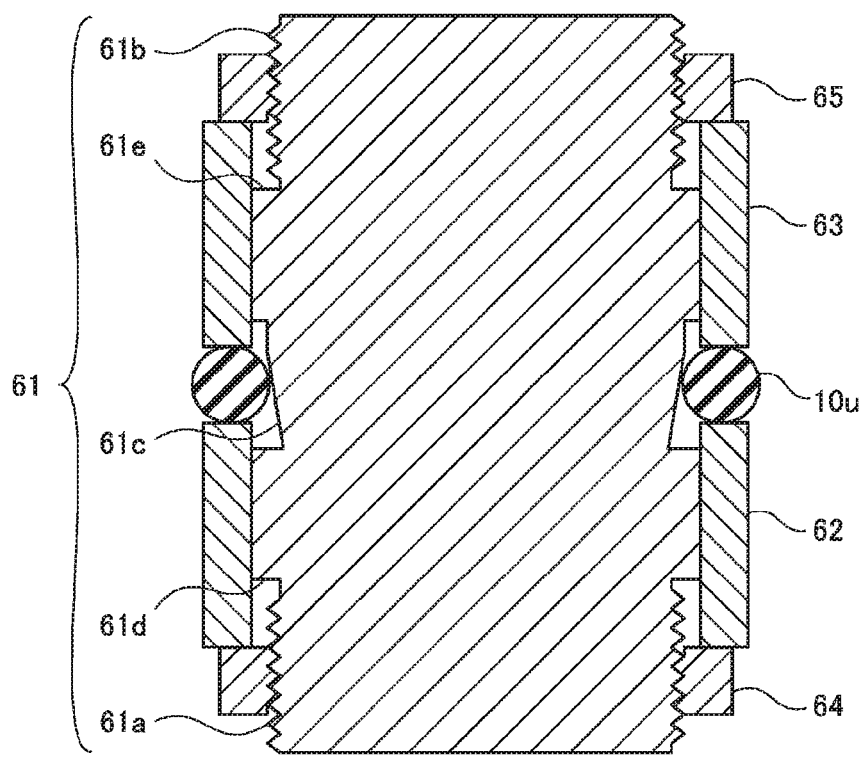
FIG. 7B is a cross-sectional view showing the internal structure of the jig set shown in FIG. 7A.

FIG. 7A schematically shows a jig set used in a seal member manufacturing method according to a fourth embodiment of the present disclosure. FIG. 7B is a cross-sectional view showing the internal structure of the jig set shown in FIG. 7A.

The jig set includes first to third jigs 61 to 63. The first jig 61 has a substantially circular columnar shape. The first jig 61 has male threaded sections 61a and 61b at axially opposite ends thereof. The first jig 61 has a tapered section 61c in the vicinity of the axial center thereof. The tapered section 61c is so shaped that the diameter thereof decreases along the axial direction of the first jig 61 with decrease of distance to the male threaded section 61a.

A cylindrical columnar section 61d, the diameter of which is slightly greater than those of the male threaded section 61a and the tapered section 61c, is disposed between the male threaded section 61a and the tapered section 61c. A cylindrical columnar section 61e, the diameter of which is slightly greater than those of the male threaded section 61b and the tapered section 61c, is disposed between the male threaded section 61b and the tapered section 61c.

The second jig 62 is a cylindrical tubular member disposed around the outer circumference of the cylindrical columnar section 61d of the first jig 61. The second jig 62 is configured to be movable in the axial direction of the first jig 61.

The third jig 63 is a cylindrical tubular member disposed around the outer circumference of the cylindrical columnar section 61e of the first jig 61. The third jig 63 is configured to be movable in the axial direction of the first jig 61.

A nut 64 engages with the male threaded section 61a. Rotating the nut 64 around the axis of the first jig 61 moves the nut 64 in the axial direction of the first jig 61. The position of the second jig 62 can thus be changed.

A nut 65 engages with the male threaded section 61b. Rotating the nut 65 around the axis of the first jig 61 moves the nut 65 in the axial direction of the first jig 61. The position of the third jig 63 can thus be changed.

Changing the position of the second jig 62 or the position of the third jig 63 can change the distance between the second jig 62 and the third jig 63.

The mechanism configured to move the second jig 62 and the third jig 63 in the axial direction of the first jig 61 does not necessarily use the nuts 64 or 65.

5.2 Operation

To manufacture the annular seal member 10j including a film on part of the surface thereof by using the jig set including the first to third jigs 61 to 63, the steps below are carried out.

As a first step, an annular member 10u, which forms the seal member 10j, is fit around the outer circumference of the tapered section 61c of the first jig 61, as shown in FIGS. 7A and 7B.

Figure 7C:
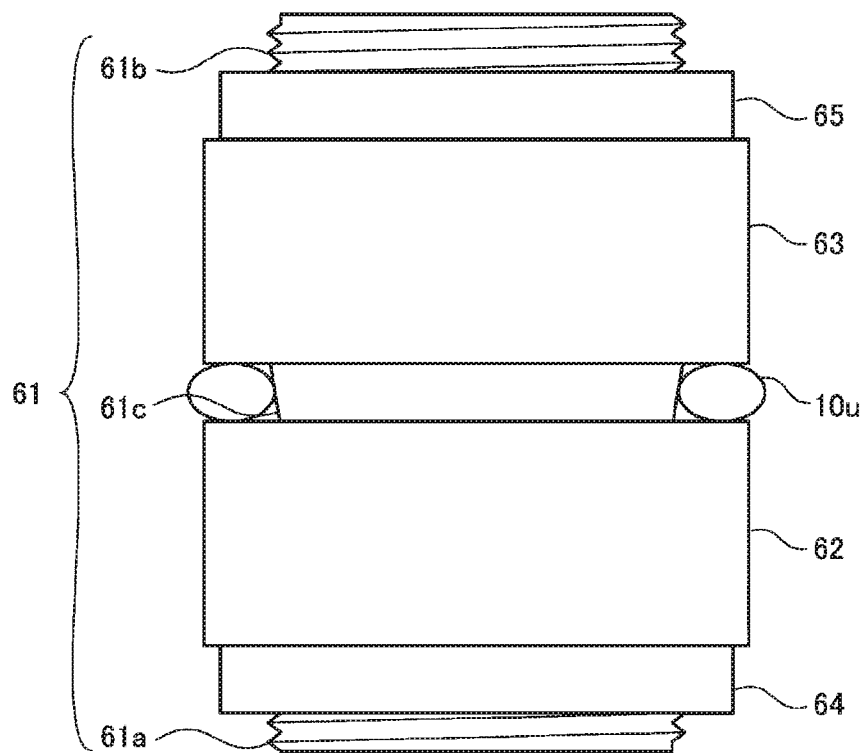
FIG. 7C schematically shows the seal member manufacturing method according to the fourth embodiment of the present disclosure.

As a second step, the annular member 10u is sandwiched between the second jig 62 and the third jig 63 to achieve a state in which the outer circumferential surface of the annular member 10u is exposed between the second jig 62 and the third jig 63, as shown in FIG. 7C.

Figure 7D:
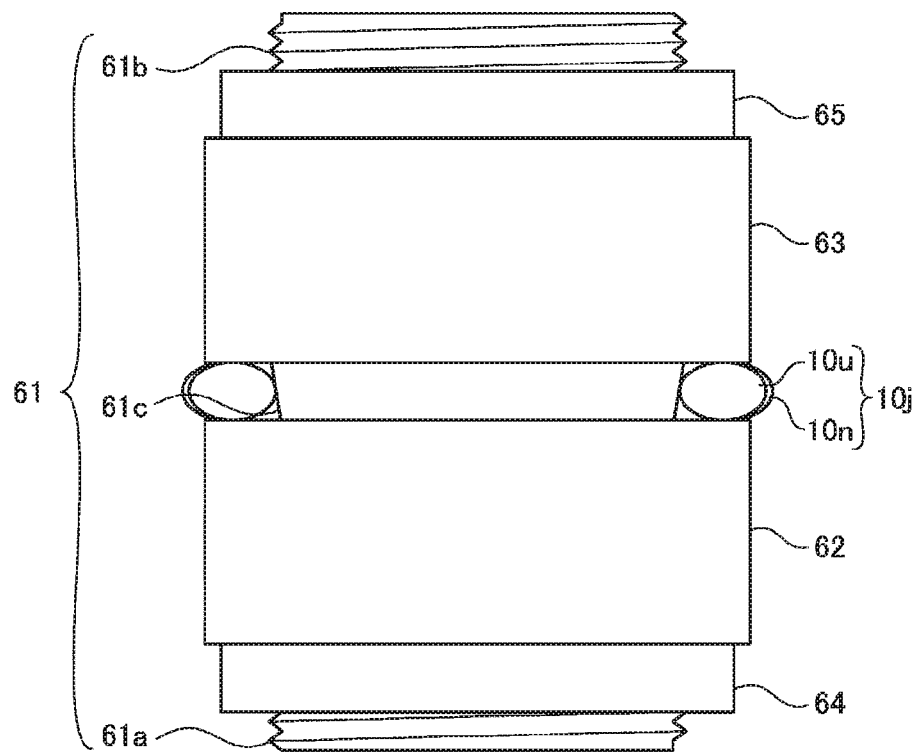
FIG. 7D schematically shows the seal member manufacturing method according to the fourth embodiment of the present disclosure.

As a third step, the film 10n is formed on the outer circumferential surface of the annular member 10u with the outer circumferential surface of the annular member 10u exposed between the second jig 62 and the third jig 63, as shown in FIG. 7D.

Let A be the length of the minor axis of the cross section of the annular member 10u used as the seal member, as shown in FIG. 4. In the second step described above, the distance between the second jig 62 and the third jig 63 may be adjusted with the annular member 10u pressed in the axial direction of the first jig 61 by the second jig 62 and the third jig 63. The length A of the minor axis of the cross section of the annular member 10u can thus be set at a predetermined value.

Let B be the length of the major axis of the cross section of the annular member 10u used as the seal member, and d be the length over which the annular member 10u is in contact with the seal surface, as shown in FIG. 4. In the first step described above, the inner circumferential surface of the annular member 10u may be in contact with the tapered section 61c. Thereafter, in the second step, the positions of the second jig 62 and the third jig 63 are adjusted to adjust the position where the annular member 10u is in contact with the tapered section 61c. The position where the annular member 10u is in contact with the tapered section 61c specifies the inner diameter of the annular member 10u. The length d over which the annular member 10u is in contact with the seal surface can thus be adjusted separately from the length B of the major axis of the cross section of the annular member 10u.

The formation of the film 10n with the dimension adjustment described above allows formation of the film 10n in accordance with the shape of the seal member 10j in the actual use thereof.

Let L be the diameter of the cross section of the seal member 10j in a state in which the seal member 10j is not compressed, as shown in FIGS. 7A and 7B, and let D be the width of the groove 10i, as shown in FIG. 4, and the following relationship is preferably satisfied:

$$d \approx L^2/2A \text{ when } D > L^2/A; \text{ and}$$

$$d \approx D/2 \text{ when } D \leq L^2/A.$$

6. Method for Forming Film Including Plurality of Layers

FIGS. 8A to 8D schematically show a seal member manufacturing method according to a fifth embodiment of the present disclosure. The jig set used in the fifth embodiment is the same as that described with reference to FIGS. 7A to 7D. In the fifth embodiment, a film including a plurality of layers is formed by the method below to manufacture the seal member.

As a first step, the annular member 10u, which forms the seal member 10j, is fit around the outer circumference of the tapered section 61c of the first jig 61. The first step is the same as that described with reference to FIGS. 7A and 7B.

Figure 8A:
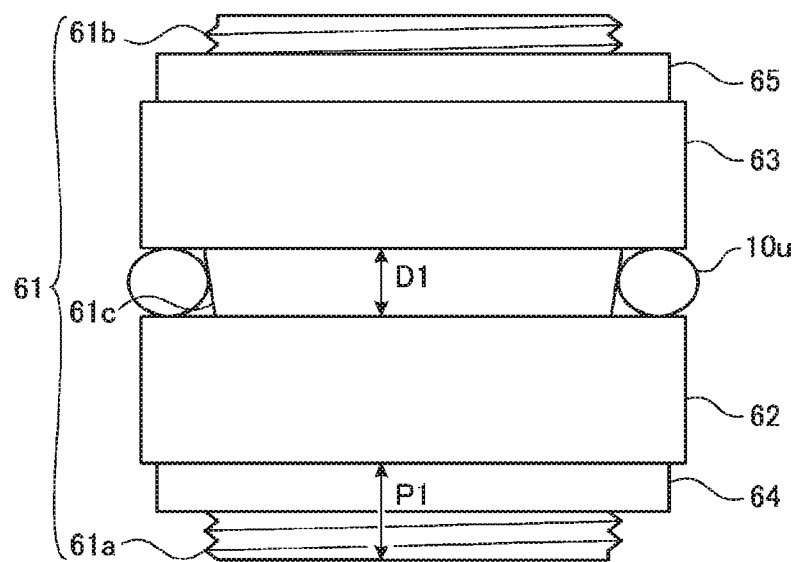
FIG. 8A schematically shows a seal member manufacturing method according to a fifth embodiment of the present disclosure.

As a second step, the annular member 10u is sandwiched between the second jig 62 and the third jig 63 to achieve the state in which the outer circumferential surface of the annular member 10u is exposed between the second jig 62 and the third jig 63. In this process, the position of the second jig 62 is set at a first predetermined position, as shown in FIG. 8A. FIG. 8A shows the first predetermined position in the form of a distance P1 from the lower end of the male threaded section 61a. The third jig 63 is so set that the distance between the third jig 63 and the second jig 62 is a first predetermined distance D1.

Figure 8B:
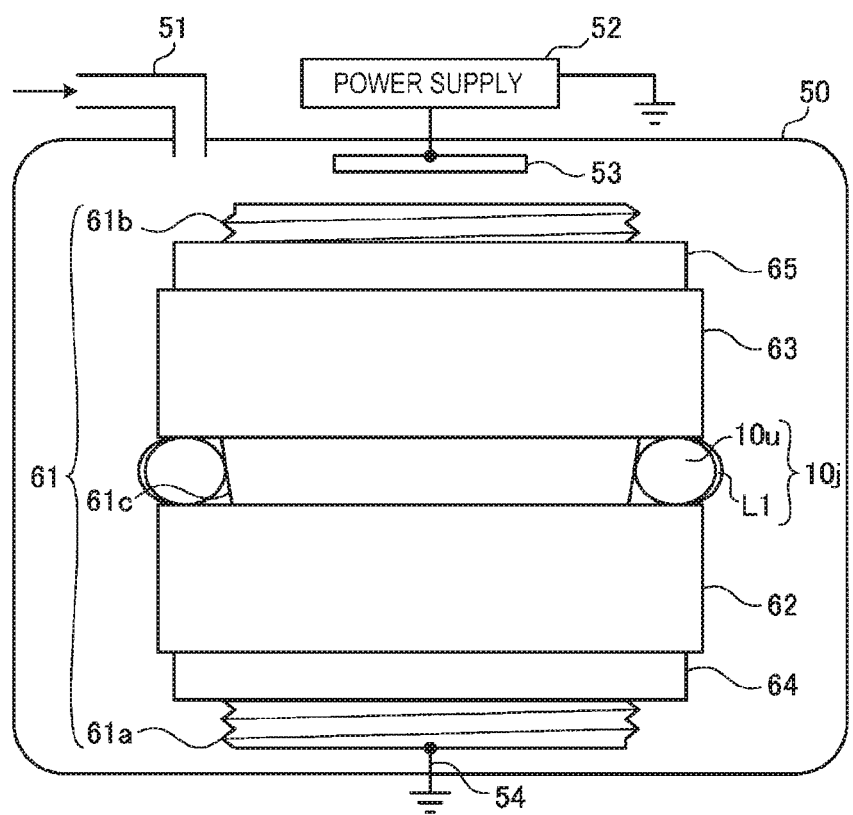
FIG. 8B schematically shows the seal member manufacturing method according to the fifth embodiment of the present disclosure.

As a third step, the first layer L1 is formed on the outer circumferential surface of the annular member 10u with the outer circumferential surface of the annular member 10u exposed between the second jig 62 and the third jig 63, as shown in FIG. 8B. To form the first layer L1, for example, a plasma ion injection film formation method may be used. For example, the jig set to which the annular member 10u is attached is accommodated in a film formation chamber 50 including a gas introduction passage 51, a power supply 52, a plasma electrode 53, and a ground line 54. A film formation gas is introduced along the gas introduction passage 51 into the film formation chamber 50 and converted into plasma by electrical energy supplied from the power supply 52 to the plasma electrode 53. The film formation gas is deposited on the outer circumferential surface of the annular member 10u to form the first layer L1.

Figure 8C:
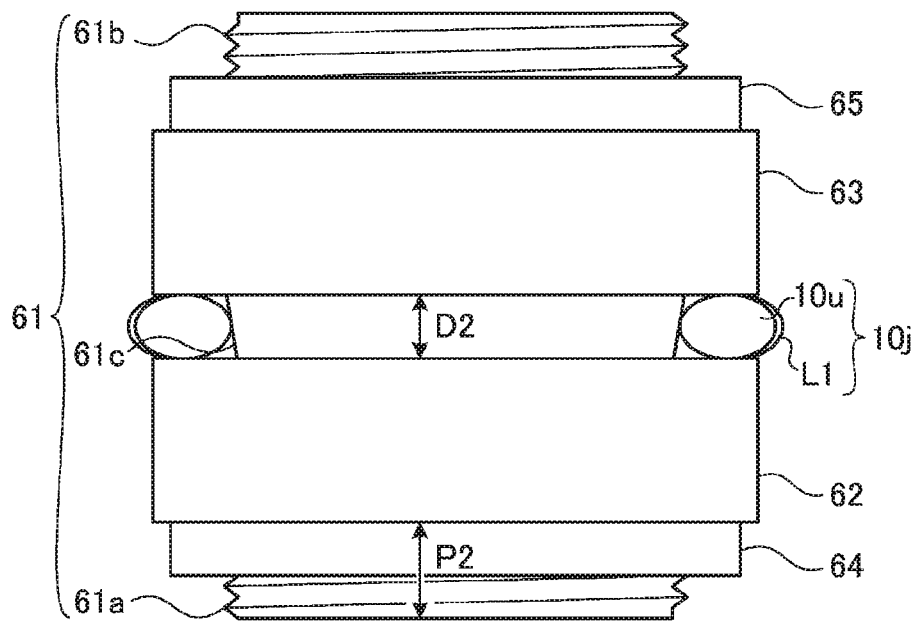
FIG. 8C schematically shows the seal member manufacturing method according to the fifth embodiment of the present disclosure.

The third step further includes moving the second jig 62 and the third jig 63 after the formation of the first layer L1. The second jig 62 is moved to a second predetermined position in the direction farther away from the third jig 63 than the first predetermined position described above. FIG. 8C shows the second predetermined position in the form of a distance P2 from the lower end of the male threaded section 61a. The third jig 63 is so set that the distance between the third jig 63 and the second jig 62 is a second predetermined distance D2, which is shorter than the first predetermined distance D1 described above. The annular member 10u is thus moved to a position closer to the male threaded section 61a than in the state shown in FIG. 8A, that is, a position where the diameter of the tapered section 61c is smaller, as shown in FIG. 8C. Further, the annular member 10u is compressed in the axial direction of the first jig 61 by a greater amount than in the state shown in FIG. 8A. The length d, over which the annular member 10u is in contact with the seal surface, thus increases.

Figure 8D:
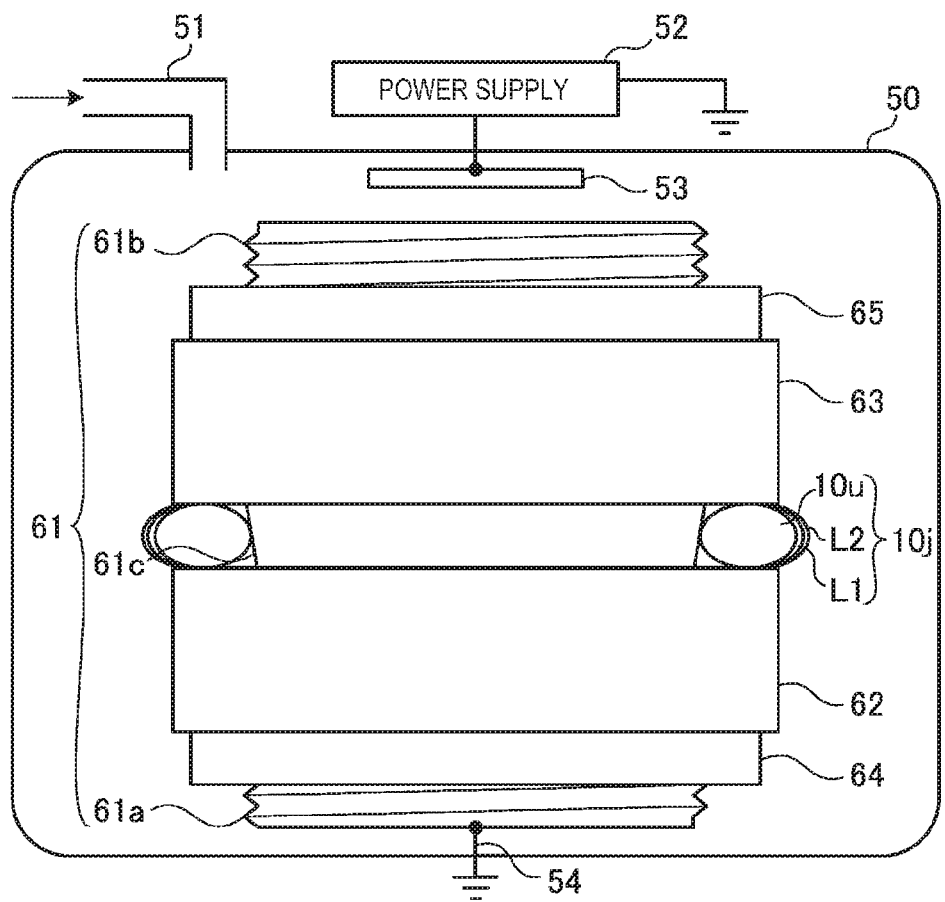
FIG. 8D schematically shows the seal member manufacturing method according to the fifth embodiment of the present disclosure.

The third step further includes forming the second layer L2 on the surface of the first layer L1 with the first layer L1 exposed between the second jig 62 and the third jig 63, as shown in FIG. 8D, after the second jig 62 and the third jig 63 are moved. The second layer L2 is formed by the same plasma ion injection film formation method as that described with reference to FIG. 8B. The second layer L2 is desirably thinner than the first layer L1, as described with reference to FIG. 5. The area of the second layer L2 is smaller than that of the first layer L1 because the contact length d is longer in the formation of the second layer L2 than in the formation of the first layer L1, as described with reference to FIG. 8C.

As the plurality of layers, two layers are not necessarily formed, and three or more layers may be formed. A layer closer to the outer circumference may be thinner. A layer closer to the outer circumference may have a smaller area.

Manufacturing the seal member 10j as described above can suppress the situation in which the film 10n peels off or breaks even when stress is induced in the seal member 10j, as described with reference to FIG. 5.

7. Others

Figure 9:
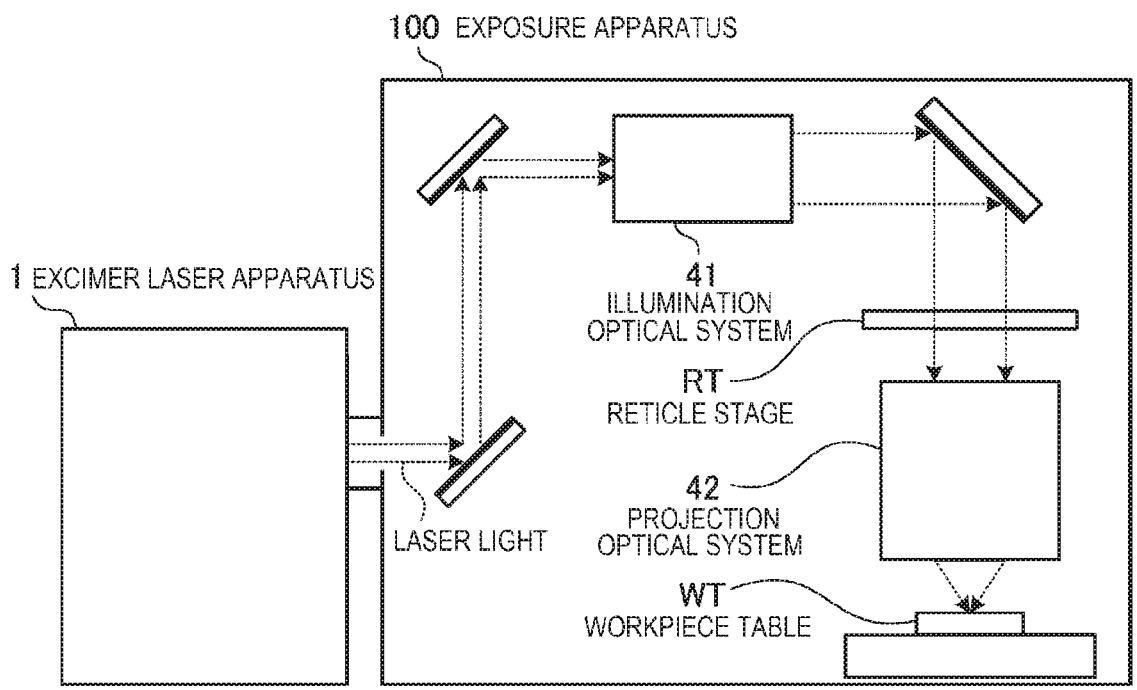
FIG. 9 schematically shows the configuration of an exposure apparatus connected to the excimer laser apparatus.

FIG. 9 schematically shows the configuration of the exposure apparatus 100 connected to the excimer laser apparatus 1. The excimer laser apparatus 1 is configured to produce the laser light and output the laser light to the exposure apparatus 100, as described above.

In FIG. 9, the exposure apparatus 100 includes an illumination optical system 41 and a projection optical system 42. The illumination optical system 41 is configured to illuminate a reticle pattern on a reticle stage RT with the laser light incident from the excimer laser apparatus 1. The projection optical system 42 is configured to perform reduction projection on the laser light having passed through the reticle to cause the laser light to be focused on a workpiece that is not shown but is placed on a workpiece table WT. The workpiece is a light sensitive substrate onto which a photoresist has been applied, such as a semiconductor wafer. The exposure apparatus 100 is configured to translate the reticle stage RT and the workpiece table WT in synchronization with each other to expose the workpiece to the laser light having reflected the reticle pattern. An electronic device can be manufactured by transferring a device pattern onto the semiconductor wafer in the exposure step described above.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser chamber of an excimer laser apparatus comprising:
    a container including a first member and a second member and configured to accommodate a laser gas in the container; and
    a seal member disposed between two seal surfaces facing each other, a seal surface of the first member and a seal surface of the second member,
    a laser-gas-side surface of the seal member being made of fluorine-based rubber, and
    an atmosphere-side surface of the seal member being formed of a film configured to suppress atmosphere transmission.

2. The laser chamber according to claim 1,
    wherein surfaces of the seal member that are in contact with the two seal surfaces are each made of fluorine-based rubber.

3. The laser chamber according to claim 1,
    wherein the film contains fluorine-containing diamond-like carbon.

4. The laser chamber according to claim 1,
    wherein the film contains at least one of $Al_2O_3$, $SiO_2$, and TiO.

5. The laser chamber according to claim 1,
    wherein the film has a thickness greater than or equal to 0.1 μm but smaller than or equal to 0.3 μm.

6. The laser chamber according to claim 1,
    wherein the film includes a plurality of layers configured to suppress the atmosphere transmission.

7. The laser chamber according to claim 6,
wherein the plurality of layers include a first layer and a second layer located closer to the atmosphere side than the first layer, and
an area of the second layer is smaller than an area of the first layer.

8. The laser chamber according to claim 6,
wherein the plurality of layers include a first layer and a second layer located closer to the atmosphere side than the first layer, and
the second layer is thinner than the first layer.

9. The laser chamber according to claim 1,
wherein the first member is made of metal, and
the second member is made of ceramic.

10. The laser chamber according to claim 1,
wherein the first member is made of metal, and
the second member includes an optical element configured to transmit laser light.

11. The laser chamber according to claim 1,
wherein the first member and the second member are each made of metal.

12. A method for manufacturing an annular seal member including a film on part of the surface thereof, the method comprising:
a first step of fitting an annular member that forms the seal member around an outer circumference of a first jig;
a second step of sandwiching the annular member between a second jig disposed around an outer circumference of the first jig and a third jig disposed around the outer circumference of the first jig and moved in an axial direction of the first jig to allow a change in a distance between the second jig and the third jig to achieve a state in which an outer circumferential surface of the annular member is exposed between the second jig and the third jig; and
a third step of forming the film on the outer circumferential surface of the annular member in a state in which an outer circumferential surface of the seal member is exposed between the second jig and the third jig.

13. The method according to claim 12,
wherein the second step includes adjusting a dimension of the annular member in the axial direction by adjusting the distance between the second jig and the third jig with the annular member pressed in the axial direction.

14. The method according to claim 12,
wherein the outer circumferential surface of the first jig has a tapered section having a diameter that changes along the axial direction,
the second jig is configured to be movable in the axial direction of the first jig,
the first step includes causing an inner circumferential surface of the annular member to come into contact with the tapered section, and
the second step includes moving at least one of the second jig and the third jig in the axial direction to adjust the dimension of an inner diameter of the annular member.

15. The method according to claim 12,
wherein the third step includes forming a first layer that is part of the film and then forming a second layer that is part of the film on an outer side of the first layer, and
after the first layer is formed but before the second layer is formed, the distance between the second jig and the third jig is changed to change the dimension of the annular member in the axial direction.

16. The method according to claim 12,
wherein the outer circumferential surface of the first jig has a tapered section having a diameter that changes along the axial direction,
the second jig is configured to be movable in the axial direction of the first jig,
the first step includes causing an inner circumferential surface of the annular member to come into contact with the tapered section,
the third step includes forming a first layer that is part of the film and then forming a second layer that is part of the film on an outer side of the first layer, and
after the first layer is formed but before the second layer is formed, at least one of the second jig and the third jig is moved in the axial direction to adjust the dimension of an inner diameter of the annular member.

17. A method for manufacturing an electronic device, the method comprising:
causing an excimer laser apparatus including a laser chamber to produce laser light;
outputting the laser light to an exposure apparatus; and
exposing a light sensitive substrate to the laser light in the exposure apparatus to manufacture the electronic device,
the laser chamber including
a container including a first member and a second member and configured to accommodate a laser gas in the container; and
a seal member disposed between two seal surfaces facing each other, a seal surface of the first member and a seal surface of the second member,
a laser-gas-side surface of the seal member being made of fluorine-based rubber, and
an atmosphere-side surface of the seal member being formed of a film configured to suppress atmosphere transmission.

* * * * *